United States Patent
Wei et al.

(10) Patent No.: US 7,342,568 B2
(45) Date of Patent: Mar. 11, 2008

(54) SHIFT REGISTER CIRCUIT

(75) Inventors: Chun-Ching Wei, Taipei (TW);
Yang-En Wu, Taipei (TW); Wei-Cheng Lin, Wurih Township, Taichung County (TW)

(73) Assignee: Au Optronics Corp., Hsinchu (TW)

( * ) Notice: Subject to any disclaimer, the term of this patent is extended or adjusted under 35 U.S.C. 154(b) by 66 days.

(21) Appl. No.: 11/385,369

(22) Filed: Mar. 21, 2006

(65) Prior Publication Data
US 2007/0046327 A1    Mar. 1, 2007

(30) Foreign Application Priority Data
Aug. 25, 2005   (TW) .............. 94129069 A

(51) Int. Cl.
*G09G 3/36* (2006.01)
*H03K 19/096* (2006.01)

(52) U.S. Cl. .................... 345/100; 326/97; 377/64; 345/104

(58) Field of Classification Search ............ 377/64–81; 345/100, 104
See application file for complete search history.

(56) References Cited
U.S. PATENT DOCUMENTS

| | | | | |
|---|---|---|---|---|
| 5,410,583 A * | 4/1995 | Weisbrod et al. | ............ | 377/75 |
| 5,517,542 A * | 5/1996 | Huq | .............. | 377/78 |
| 5,949,398 A * | 9/1999 | Kim | .............. | 345/100 |
| 6,300,928 B1 * | 10/2001 | Kim | .............. | 345/92 |
| 6,556,646 B1 * | 4/2003 | Yeo et al. | ...... | 377/54 |
| 6,876,353 B2 * | 4/2005 | Morosawa et al. | ......... | 345/100 |
| 2007/0035505 A1 * | 2/2007 | Lin et al. | ........ | 345/100 |
| 2007/0040793 A1 * | 2/2007 | Kim et al. | ........ | 345/100 |
| 2007/0086558 A1 * | 4/2007 | Wei et al. | ........ | 377/64 |

* cited by examiner

*Primary Examiner*—Rexford Barnie
*Assistant Examiner*—Dylan White
(74) *Attorney, Agent, or Firm*—Thomas, Kayden, Horstemeyer & Risley

(57) ABSTRACT

A shift register circuit having shift registers comprising a first transistor having a gate and a first source/drain for receiving an output signal of a pre-stage shift register, a second transistor having a gate coupled to a second source/drain of the first transistor, a first source/drain coupled to a first clock signal, and a second source/drain coupled to a output, a first pull-down module coupled to the output terminal, for receiving the first clock signal, wherein the output is coupled to a first voltage level when the output signal of pre-stage shift register and the first clock signal are at low voltage level, and a second pull-down module coupled to the output and a second clock signal, wherein the output is coupled to a first voltage level when the output signal of pre-stage shift register and the second clock signal are at low voltage level.

18 Claims, 11 Drawing Sheets

SHIFT REGISTER CIRCUIT

BACKGROUND

The invention relates to a driver circuit of a liquid crystal display, and more particularly to a shift register circuit reducing the voltage shifting.

In the majority technology of LCDs a driver circuit is disposed on the glass substrate thereof, and the reduction of the cost of the driver IC is advantageous. Take the TFT LCD for example, instable features, such as voltage shifting of the threshold voltage, has become a critical issue of the circuit design. Please refer to FIG. 1. FIG. 1 is a voltage-current schematic diagram of a TFT transistor fabricated in a 300um process. Curves 11, 12, 13, 14 and 15 respectively indicate the voltage-current curve of the TFT transistor after 0, 2, 4, 6 and 8 continuous hours of using. It is found that the shifting of the threshold voltage is affected by the hours of use. The shifting of threshold voltage causes the shift register to output an incorrect signal, thus, the display cannot show the correct output.

Please refer to FIG. 2. FIG. 2 is a circuit diagram of a conventional shift register. Transistors T21 and T22 turn on in response to receiving voltage VDD, and thus, the threshold voltage shifts and the output signal N cannot stay in the off state. Please refer to FIG. 3. FIG. 3 is a schematic diagram of the output signal of shift register of FIG. 2. Curve 31 is the voltage-time curve when the shift register of FIG. 2 begins operating. Curve 32 is the voltage-time curve of the shift register of FIG. 2 after 6 continuous hours of use. According to curve 32, the conventional shift register cannot keep the output in the off state, and thus the display cannot output the correct signals.

SUMMARY

The invention provides a shift register circuit capable of reducing the voltage shifting caused by the transistor.

In one aspect of the invention, a shift register circuit having a series of cascading shift registers comprises a first transistor, a second transistor, a first pull-down module and a second pull-down module. The first transistor has a gate, a first source/drain and a second source/drain, wherein the gate and the first source/drain of the first transistor receive an output signal of a pre-stage shift register. The second transistor has a gate, a first source/drain and a second source/drain, wherein the gate of the second transistor is coupled to the second source/drain of the first transistor, the first source/drain of the second transistor receives a first clock signal and the second source/drain of the second transistor is coupled to an output terminal. The first pull-down module is coupled to the output terminal and receives the first clock signal, wherein the output terminal is coupled to a first voltage level when the output signal of the pre-stage shift register and the first clock signal is at a low voltage level. The second pull-down module is coupled to the output terminal and receives a second clock signal, wherein the output terminal is coupled to the first voltage level when the output signal of the pre-stage shift register and a second clock signal is at the low voltage level.

In one aspect of the invention, a shift register circuit having a series of cascading shift registers comprises the following elements: a first transistor having a gate, a first source/drain and a second source/drain, wherein the gate and the first source/drain of the first transistor receive an output signal of a pre-stage shift register; a second transistor having a gate, a first source/drain and a second source/drain, wherein the gate of the second transistor is coupled to the second source/drain of the first transistor, the first source/drain of the second transistor receives a first clock signal and the second source/drain of the second transistor is coupled to a output terminal; a third transistor having a gate, a first source/drain and a second source/drain, wherein the first source/drain of the third transistor is coupled to the output terminal and the second source/drain of the third transistor is coupled to the first voltage level; a fourth transistor having a gate, a first source/drain and a second source/drain, wherein the second source/drain of the fourth transistor is coupled to the first voltage level, the gate of the fourth transistor is coupled to the gate of the third transistor and the first source/drain of the fourth transistor is coupled to the gate of the second transistor; a fifth transistor having a gate, a first source/drain and a second source/drain, wherein the gate and the first source/drain of the fifth transistor receives the second clock signal and the second source/drain of the fifth transistor is coupled to the gate of the third transistor; a sixth transistor having a gate, a first source/drain and a second source/drain, wherein the second source/drain of the sixth transistor is coupled to the first voltage level, the gate of the sixth transistor receives the first clock signal, and the second source/drain of the sixth transistor is coupled to the gate of the third transistor; a seventh transistor having a gate, a first source/drain and a second source/drain, wherein the second source/drain of the seventh transistor is coupled to the first voltage level, the gate of the seventh transistor receives the output signal of pre-stage shift register, and the seventh transistor is coupled to the gate of the third transistor; an eighth transistor having a gate, a first source/drain and a second source/drain, wherein the first source/drain of the eighth transistor is coupled to the output terminal and the second source/drain of the eighth transistor is coupled to the first voltage level; a ninth transistor having a gate, a first source/drain and a second source/drain, wherein the second source/drain of the ninth transistor is coupled to the first voltage level, the gate of the ninth transistor is coupled to the gate of the eighth transistor, and the second source/drain of the ninth transistor is coupled to the gate of the second transistor; a tenth transistor having a gate, a first source/drain and a second source/drain, wherein the gate and the first source/drain of the tenth transistor receives the first clock signal, and the second source/drain of the tenth transistor is coupled to the gate of the eighth transistor; an eleventh transistor having a gate, a first source/drain and a second source/drain, wherein the second source/drain of the eleventh transistor is coupled to the first voltage level, the gate of the eleventh transistor receives the first clock signal, and the first source/drain of the eleventh transistor is coupled to the gate of the eighth transistor; and a twelfth transistor having a gate, a first source/drain and a second source/drain, wherein the second source/drain of the twelfth transistor is coupled to the first voltage level, the gate of the twelfth transistor is coupled to the output terminal, and the first source/drain of the twelfth transistor is coupled to the gate of the eighth transistor.

DETAILED DESCRIPTION

Figure 4:
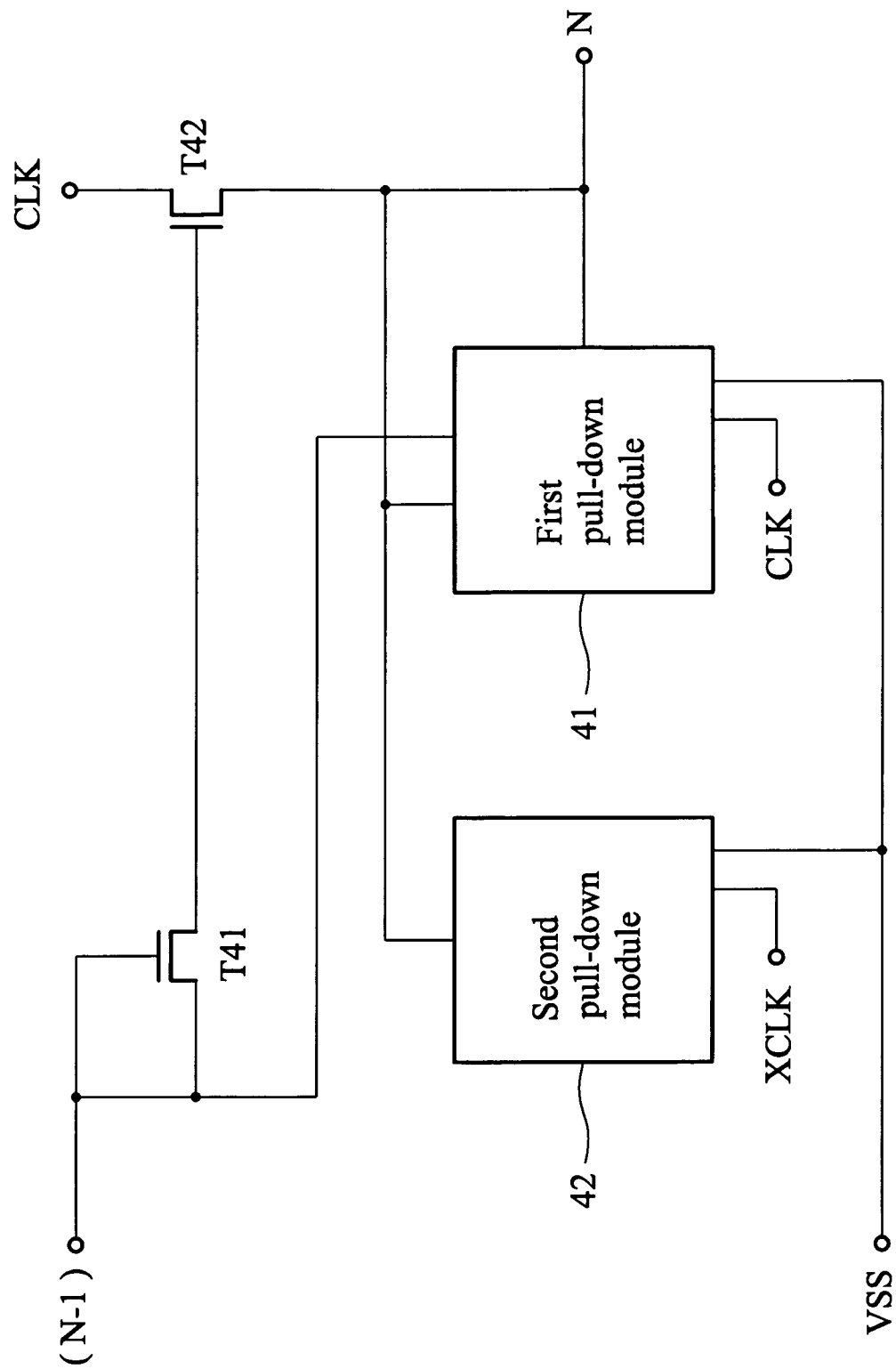
FIG. 4 is a schematic diagram of a first embodiment of a shift register according to the invention.

FIG. 4 is a schematic diagram of a first embodiment of a shift register according to the invention. In FIG. 4, the first pull-down module 41 and the second pull-down module 42 alternately pull down the output signal N of the shift register to a low voltage source, VSS, to keep the output signal N in an off-state. The gate and first source/drain of the transistor T41 are coupled to the output signal N−1 of the pre-stage shift register and the first pull-down module 41. The second source/drain of transistor T41 is coupled to the gate of transistor T42. The first source/drain of transistor T42 receives a first clock signal CLK, and the second source/drain of transistor T42 is coupled to the first pull-down module 41, the second pull-down module 42 and the output signal N. The first pull-down module 41 and the second pull-down module 42 respectively receive the first clock signal CLK and a second clock signal XCLK. When the output signal N−1 and the first clock signal CLK are at low voltage level, the output signal N is coupled to the low voltage source VSS through the first pull-down module 41. When the output signal N−1 and the second clock signal XCLK are at low voltage level, the output signal N is coupled to the low voltage source VSS through the second pull-down module 42. When the gate of transistor T42 and the first clock signal CLK are at high voltage level, the output signal N is at high voltage level.

Figure 5:
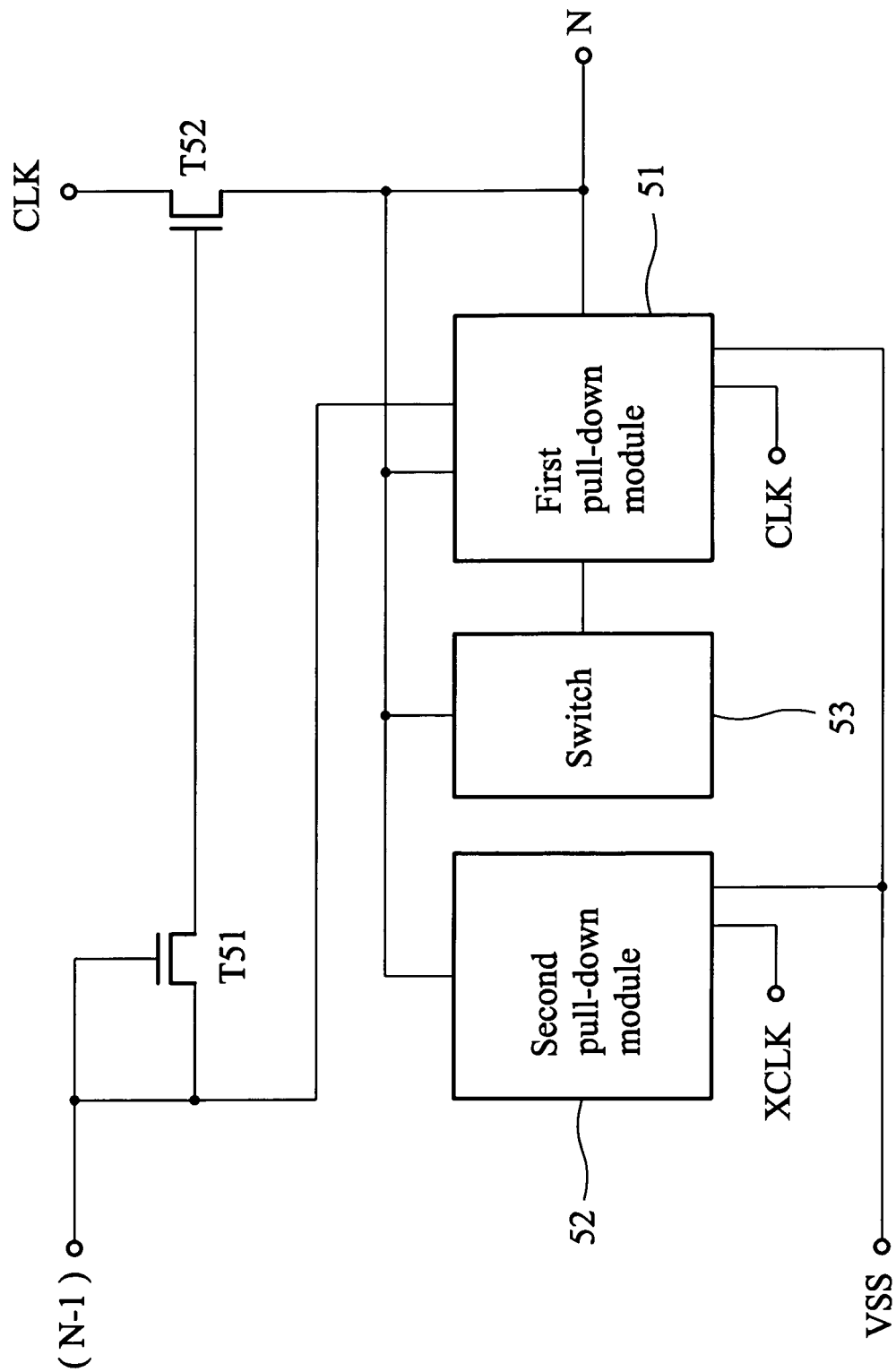
FIG. 5 is a schematic diagram of a second embodiment of the shift register circuit according to the invention.

FIG. 5 is a schematic diagram of a second embodiment of the shift register circuit according to the invention. The difference between the first embodiment of FIG. 4 and the second embodiment of FIG. 5 is the switch 53 which is operable to turn off the first pull-down module 51 when the output signal N is at high voltage level. The second source/drain of transistor T51 is coupled to the gate of the transistor T52 whose first source/drain receives a first clock signal and second source/drain is coupled to the first pull-down module 51, the second pull-down module 52 and the output signal N. The first pull-down module 51 and the second pull-down module 52 respectively receive the first clock signal CLK and a second clock signal XCLK. When the output signal N−1 and the first clock signal CLK are at low voltage level, the output signal N is coupled to the low voltage source VSS through the first pull-down module 51. When the output signal N−1 and the second clock signal XCLK are at low voltage level, the output signal N is coupled to the low voltage source VSS through the second pull-down module 52. When the gate of transistor T42 and the first clock signal CLK are at high voltage level, the output signal N is at high voltage level and the switch 53 turns off the first pull-down module 51.

Figure 6:
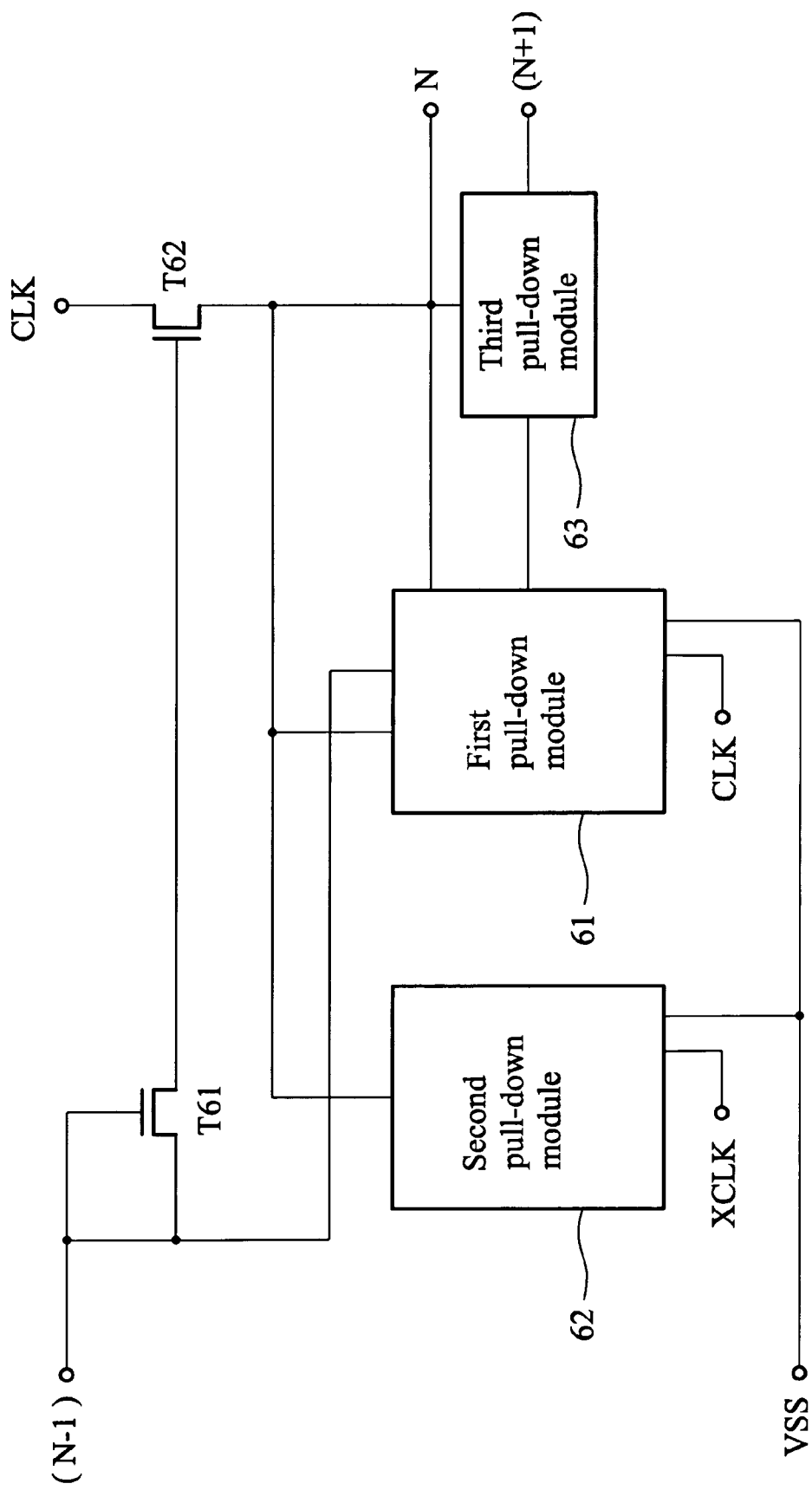
FIG. 6 is a schematic diagram of a third embodiment of the shift register circuit according to the invention.

FIG. 6 is a schematic diagram of a third embodiment of the shift register circuit according to the invention. In FIG. 6, the output signal N+1 of a post-stage shift register serves as a voltage source to pull down the output signal N to the VSS. The gate and the first source/drain of the transistor T61 receive the output signal N−1 of a pre-stage shift register. The second source/drain of transistor T61 is coupled to the gate of transistor T62. The first source/drain of transistor T62 is coupled to a first clock signal CLK, and second source/drain of transistor T62 is coupled to the first pull-down module 61, a second pull-down module 62 and the output signal N. The third pull-down module 63 is coupled to the second source/drain of transistor 62, the first pull-down module 61 and the output signal N+1 of the post-stage shift register. The first pull-down module 61 and the second pull-down module 62 respectively receive the first clock signal CLK and a second clock signal XCLK. When the output signal N−1 and the first clock signal CLK are at low voltage level, the output signal N is coupled to the low voltage source VSS through the first pull-down module 61. When the gate of transistor T62 and the second clock signal XCLK are at low voltage level, the output signal N is coupled to the low voltage source VSS through the second pull-down module 62. When the gate of transistor T62 and the first clock signal CLK are at high voltage level, the output signal N is at high voltage level. When the output signal N+1 is at high voltage level, the output signal N is coupled to the VSS through the third pull-down module 63.

In FIGS. 4, 5 and 6, the first pull-down module 41, 51 and 61 and the second pull-down module 42, 52 and 62, the third pull-down module and the switch 53 are made of one or combination of resistors, capacitors, transistors, multiplexers, logic gates and other similar elements. To further illustrate the pull-down module, a plurality of embodiments is provided, but the invention is not intended to be limited thereto.

Figure 7:
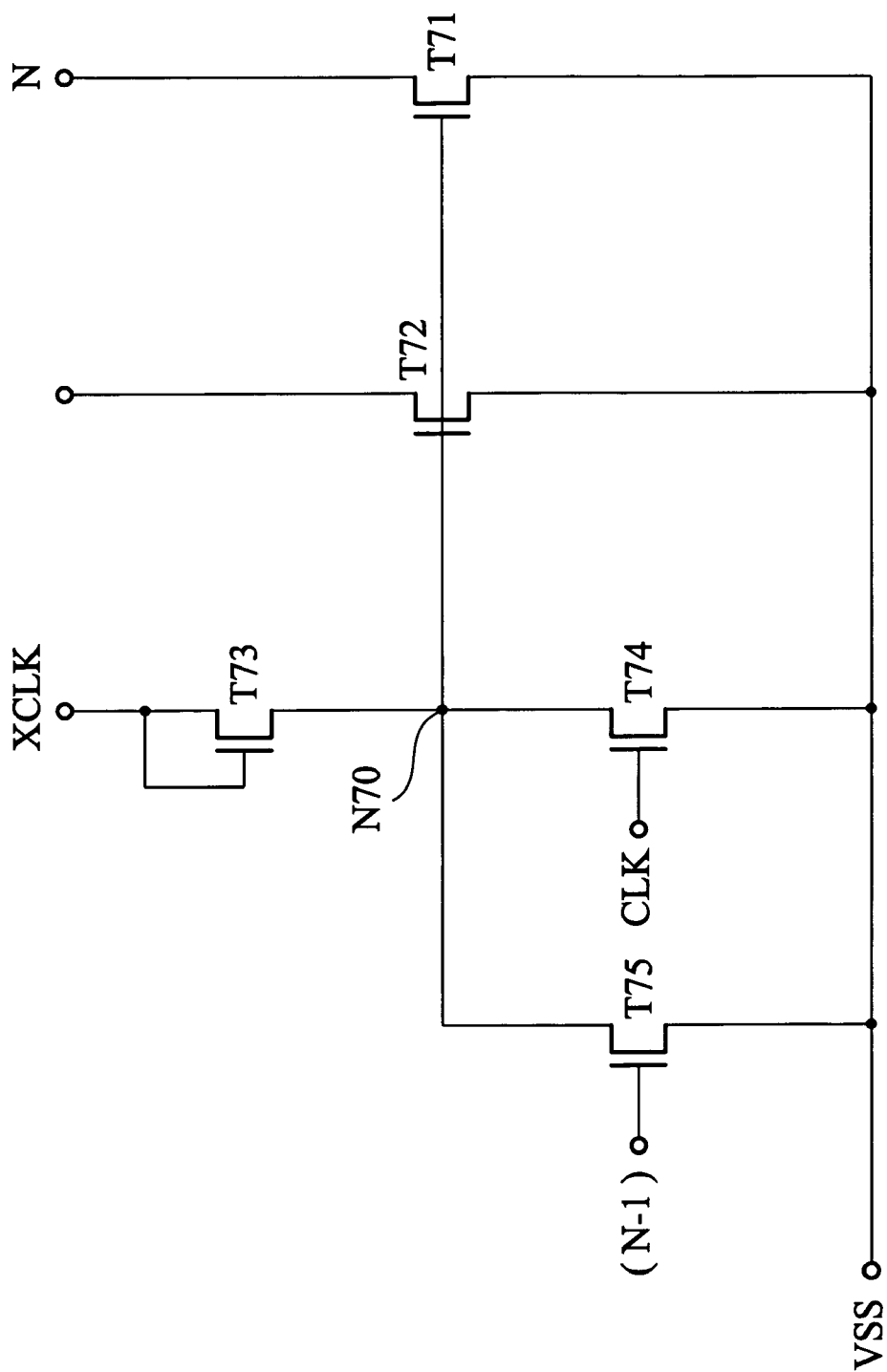
FIG. 7 is a circuit diagram of an embodiment of the first pull-down module according to the invention.

FIG. 7 is a circuit diagram of an embodiment of the first pull-down module according to the invention. The circuit of the FIG. 7 is suitable for the first pull-down module 41, 51 and 61. The first source/drain of transistor T71 receives the output signal N and the second source/drain of transistor T71 is coupled to a low voltage source VSS. The first source/drain of transistor T72 is coupled to a gate of transistor, such as T42, T52 and T62, the second source/drain of transistor T72 is coupled to VSS, and the gate of transistor T72 is coupled to the gate of transistor T71. The gate and first source/drain of transistor T73 receive a second clock signal XCLK, and the second source/drain of transistor T73 is coupled to the gate of transistor T71 and a first source/drain of transistor T74. The gate of transistor T74 receives a first clock signal CLK, and the second source/drain of transistor T74 and T75 are coupled to VSS. The gate of transistor T75 is coupled to the output signal N−1 of a pre-stage shift register, and the first source/drain of transistor T75 is coupled to the gate of transistor T71. When the output signal N−1 is at high voltage level, transistor T75 turns on and thus the voltage level of node N70 is coupled to the VSS to turn off the transistors T72 and T71. When the output signal N−1 and the first clock signal CLK are at low voltage level, the second clock signal XCLK and the voltage level of node N70 are at high voltage level, and thus the transistors T72 and T71 turn on to couple the output signal N to VSS.

Figure 8:
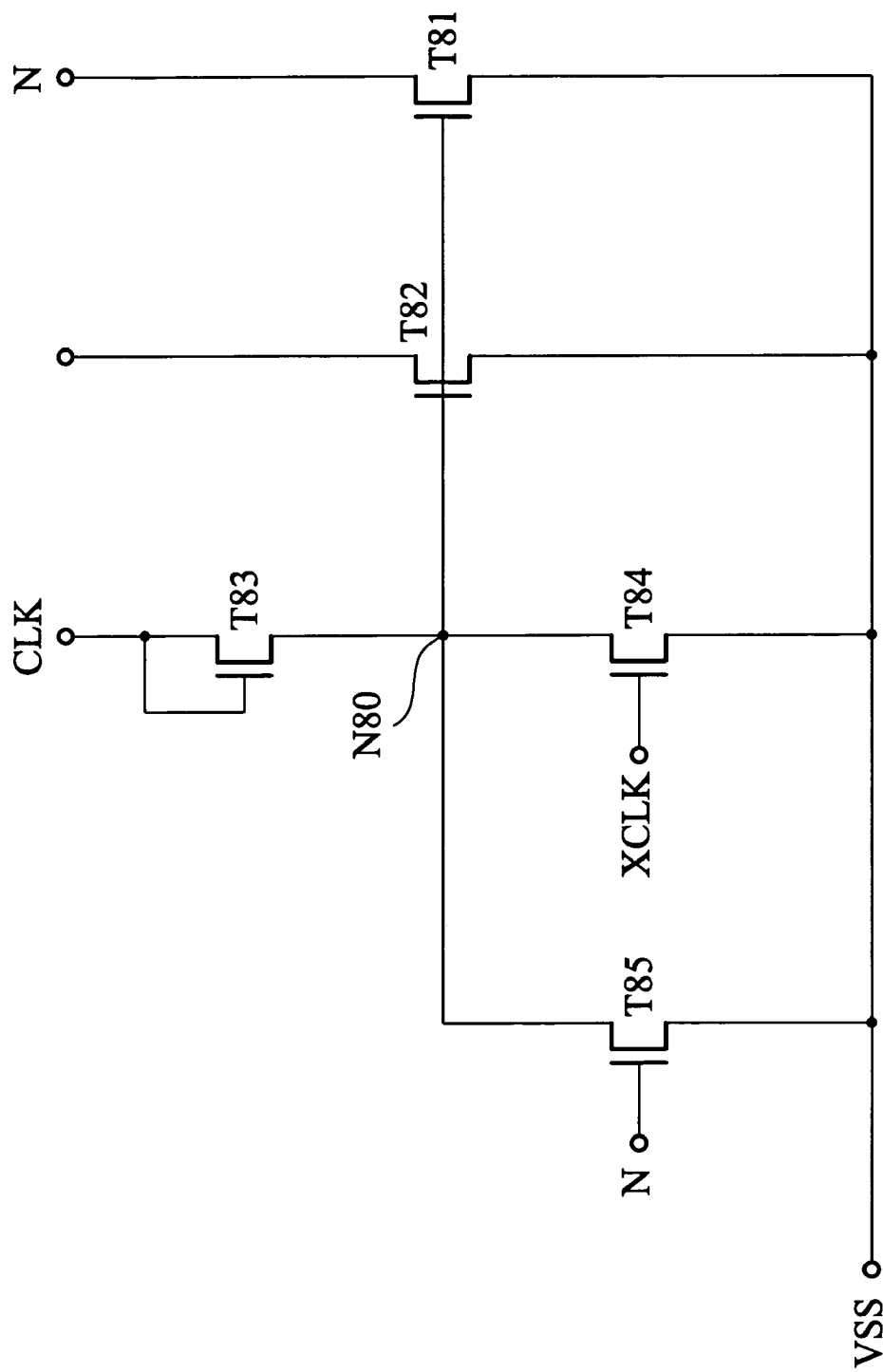
FIG. 8 is a circuit diagram of an embodiment of the second pull-down module according to the invention.

FIG. 8 is a circuit diagram of an embodiment of the second pull-down module according to the invention. The circuit of the FIG. 8 is suitable for the second pull-down module 42, 52 and 62. The first source/drain of transistor T81 receives the output signal N, and the second source/drain is coupled to VSS. The first source/drain of transistor T82 is coupled to a gate of transistor, such as T42, T52 and T62, the second source/drain of transistor T82 is coupled to VSS, and the gate of transistor T82 is coupled to the gate of transistor T81. The gate and the first source/drain of transistor T83 receive the first clock signal CLK, and the second source/drain of transistor T83 is coupled to the gate of transistor T81. The gate of transistor T84 is coupled to the second clock signal XCLK, the first source/drain of transistor T84 is coupled to the second source/drain of the transistor T83, and the second source/drain of transistor T84 is coupled to VSS. The gate of transistor T85 is coupled to the output signal N, the first source/drain of transistor T85 is coupled to the gate of transistor T81, and the second source/drain is coupled to the VSS. When the output signal N and the second clock signal XCLK are at low voltage level, the transistor T83 is turned on and the node N80 is at high voltage level to turn on the transistors T82 and T81. After turning on the transistor T81, the output signal N is coupled to VSS. When the output signal N is at high voltage level, the transistor T85 is turned on and the node N80 is coupled to VSS to turn off the transistors T81 and T82 to keep the output signal N at the high voltage level.

Figure 9:
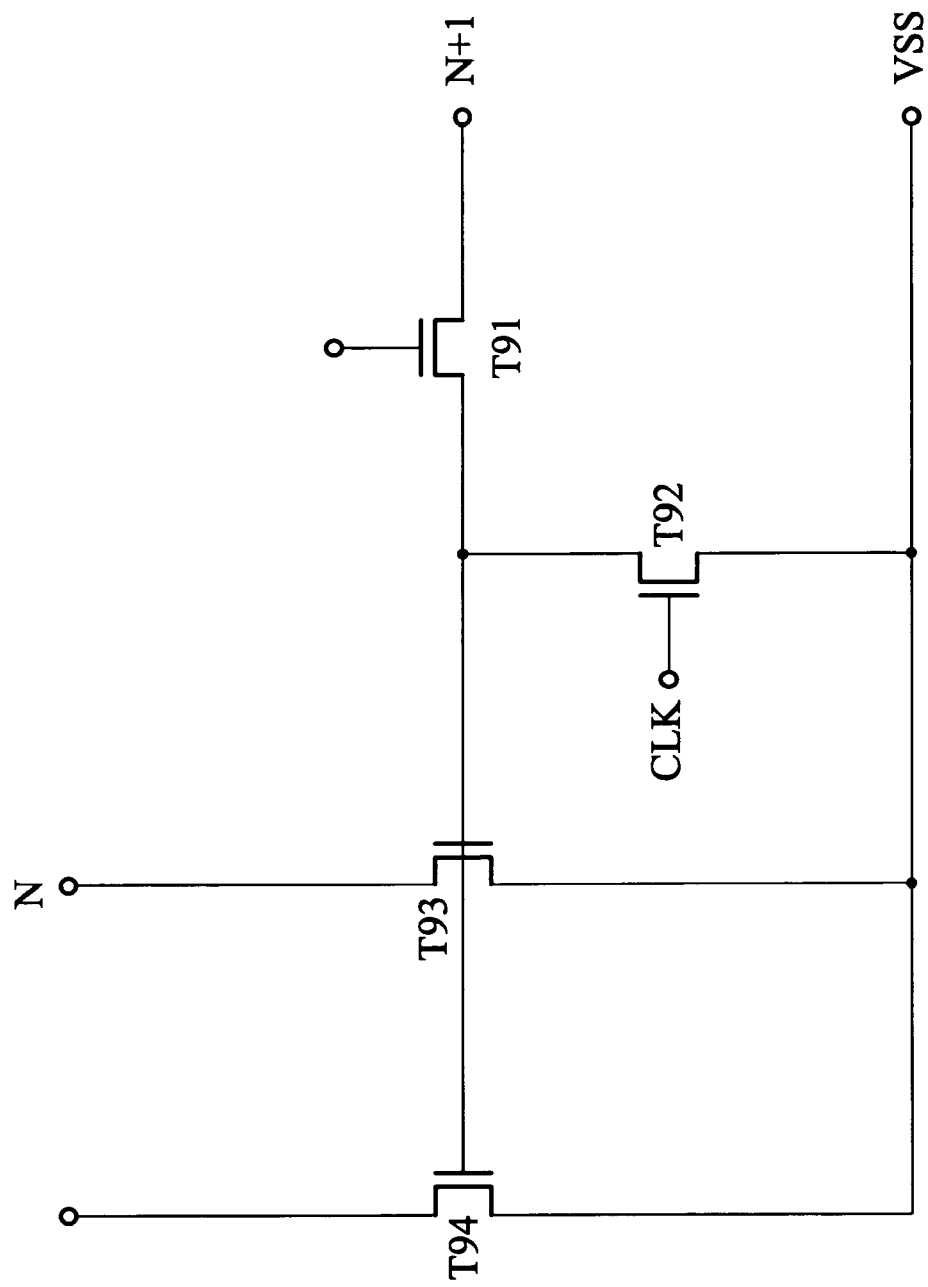
FIG. 9 is a circuit diagram of an embodiment of the third pull-down module according to the invention.

FIG. 9 is a circuit diagram of an embodiment of the third pull-down module according to the invention. The circuit of the FIG. 9 is suitable for the third pull-down module 63. The first source/drain of transistor T91 is coupled to the first pull-down module, such as the circuit of FIG. 7. The second source/drain of transistor. T91 is coupled to the first source/drain of transistor T92. The second source/drain of transistor T92 is coupled to VSS, and the gate of transistor T92 is coupled to the first clock signal CLK. The first source/drain of transistor T93 receives the output signal N, and the second source/drain is coupled to VSS. The first source/drain of transistor T94 is coupled to a gate of transistor, such as T42, T52 and T62, the second source/drain of transistor T94 is coupled to VSS, and the gate of transistor T94 is coupled to the gate of transistor T93. When the output signal N+1 and the gate of transistor T91 are at high voltage level and the first clock signal is at low voltage level, the transistor T93 is turned on and thus the output signal N is coupled to VSS.

Figure 10:
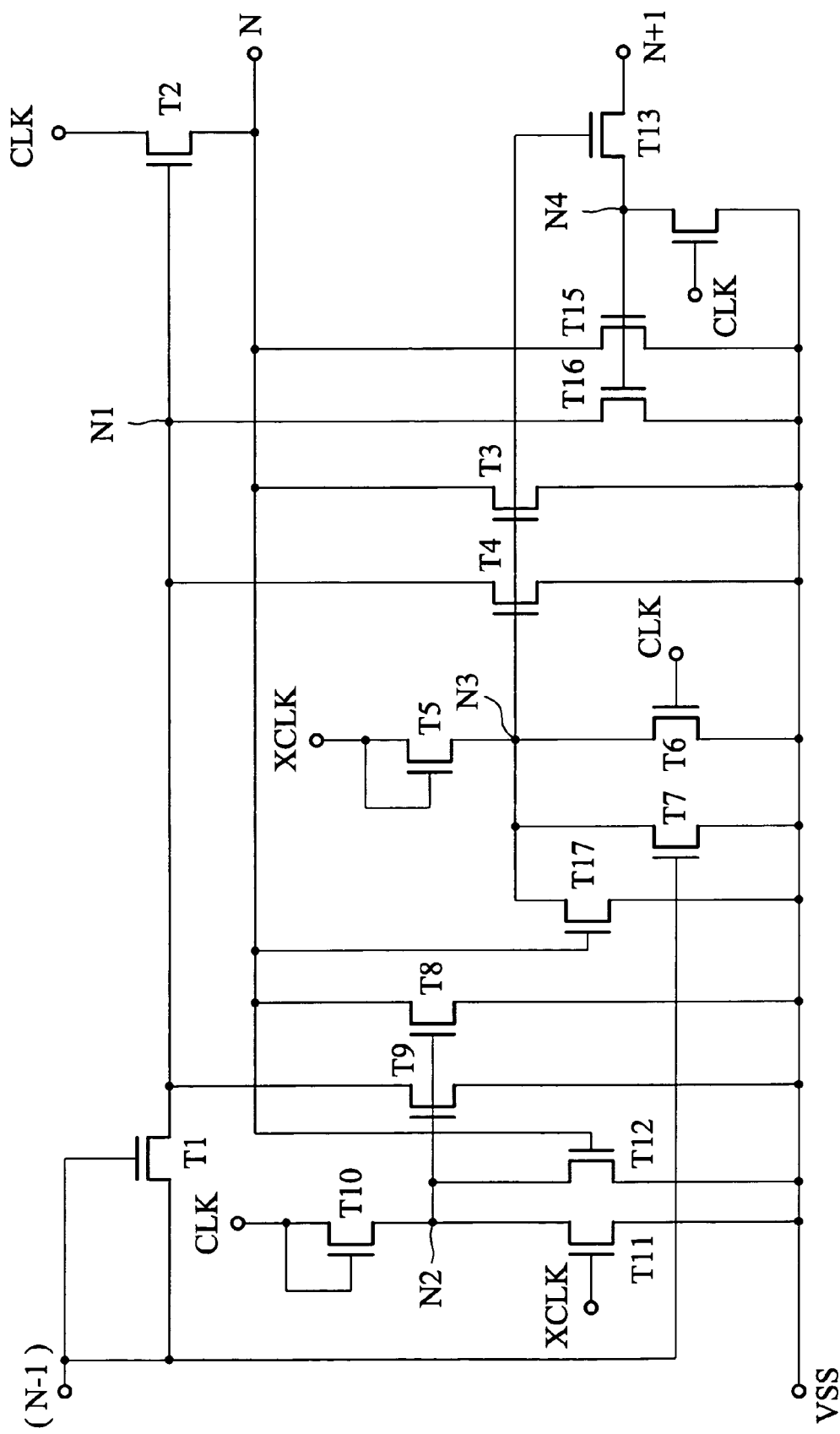
FIG. 10 is a circuit diagram of a fourth embodiment of a shift register according to the invention.

FIG. 10 is a circuit diagram of a fourth embodiment of a shift register according to the invention. The gate and first source/drain of transistor T1 are coupled to an output signal N−1 of the pre-stage shift register. The gate of transistor T2 is coupled to the second source/drain of transistor T1, the first source/drain of transistor T2 receives a first clock signal CLK, and the second source/drain of transistor T2 receives the output signal N. The first source/drain of transistor T3 receives the output signal N, and the second source/drain of transistor T3 is coupled to a low voltage source, VSS. The second source/drain of transistor is coupled to VSS, the gate of transistor T4 is coupled to the gate of transistor T3, and the first source/drain of transistor T4 is coupled to the gate of transistor T2. The gate and first source/drain of transistor T5 receive a second clock signal XCLK, and the second source/drain of transistor T5 is coupled to the gate of transistor T3. The second source/drain of transistor T6 is coupled to VSS, the gate of transistor T6 receives the first clock signal CLK, and the first source/drain of T6 is coupled to the gate of transistor T3. The second source/drain of T7 is coupled to VSS, the gate of transistor T7 receives the output signal N−1, and the first source/drain of transistor T7 is coupled to the gate of transistor T3. The first source/drain of transistor T8 receives the output signal N, and the second source/drain of transistor T8 is coupled to VSS. The second source/drain of transistor T9 is coupled to VSS, the gate of transistor T9 is coupled to the gate of transistor T8, and the first source/drain of transistor T9 is coupled to the gate of transistor T2. The gate and first source/drain of transistor T10 receive the first clock signal CLK, and the second source/drain of transistor T10 is coupled to the gate of transistor T8. The second source/drain of transistor T11 is coupled to VSS, the gate of transistor T11 receives the second clock signal XCLK, and the first source/drain of transistor T11 is coupled to the gate of transistor T8. The second source/drain of transistor T12 is coupled to VSS, the gate of transistor T12 receives the output signal N, and the first source/drain of transistor T12 is coupled to the gate of transistor T8. The gate of transistor T13 is coupled to the gate of transistor T3, and the first source/drain of transistor T13 receives the output signal N+1. The first source/drain of transistor T14 is coupled to the second source/drain of transistor T13, the second source/drain of transistor T14 is coupled to the VSS, and the gate of transistor T14 receives the first clock signal CLK. The gate of transistor T15 is coupled to the second source/drain of transistor T13, and the first source/drain of transistor T15 receives the output signal N. The gate of transistor T16 is coupled to the second source/drain of transistor T13, the second source/drain of transistor T16 is coupled to VSS, and the first source/drain of transistor T16 is coupled to the gate of transistor T2. The gate of transistor T17 receives the output signal N, the first source/drain of transistor T17 is coupled to the gate of transistor T3, and the second source/drain of transistor T17 is coupled to VSS.

Figure 11:
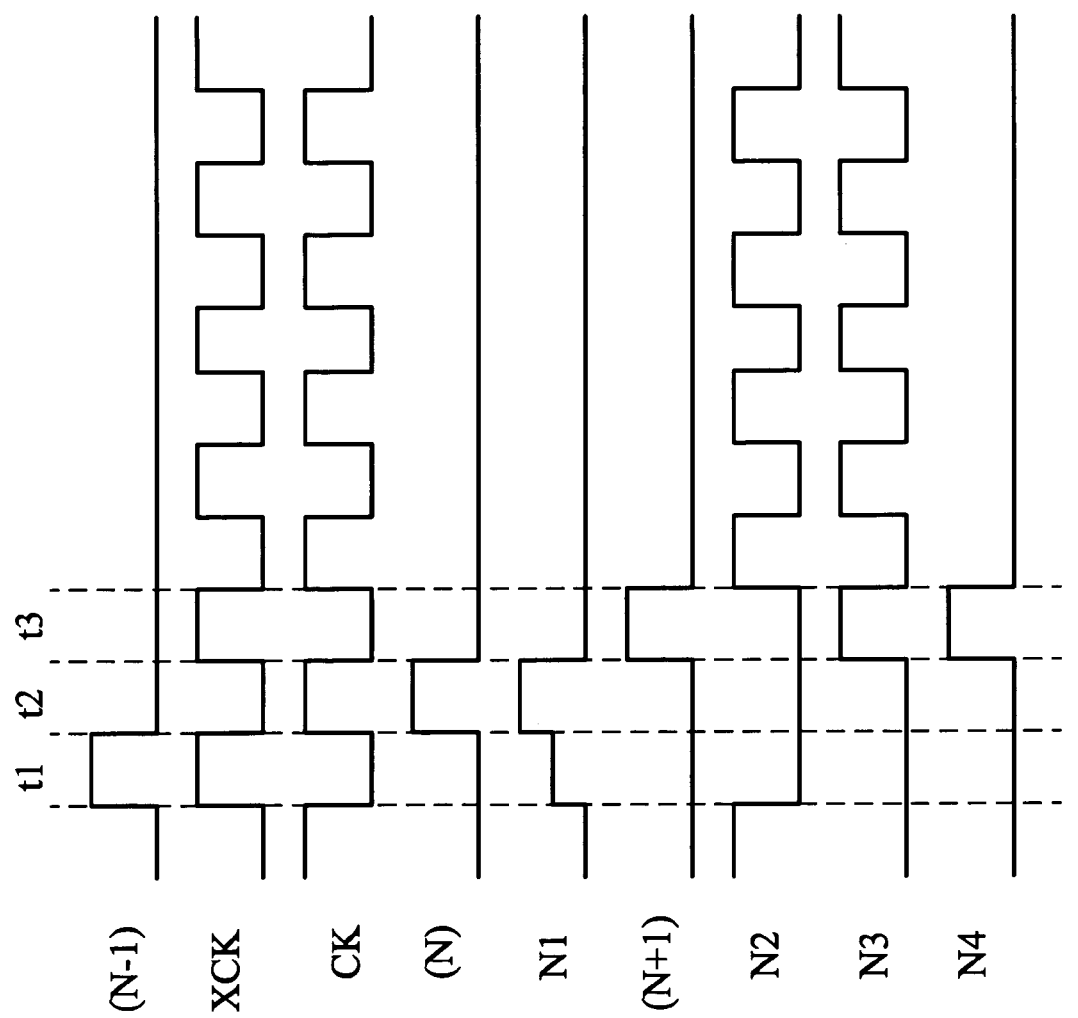
FIG. 11 is a waveform of the circuit of FIG. 10.

To further describe the circuit of FIG. 10, please refer to FIG. 11. FIG. 11 is a waveform of the circuit of FIG. 10. During the time period t1, the output signal N−1 is at high voltage level, and thus the transistor T1, T2 and T7 turns on. The node N1 is at high voltage, thus the transistor T2 turns on. The output signal N is at low voltage level because the transistor T2 turns on and the first clock signal is at low voltage level. Transistors T4 and T3 turn off because the transistor T7 is on. Transistors T8 and T9 turn off because the transistor T11 turns on due to the second clock signal XCLK and thus the node N2 is coupled to the low voltage source VSS.

During time period t2, the output signal N−1 is at low voltage level, thus transistors T1 and T7 turn off and the voltage level of node N1 stays at high voltage level because there is no discharge path for the node N1. During t2, the first clock signal CLK is at high voltage level and thus the voltage level of node N1 increases because of the capacitor coupling effect between the first source/drain and the gate of transistor T2. The output signal N is at high voltage level because the transistor T2 turns on and the first clock signal CLK is at high voltage level. Transistor T17 turns on due to the output signal N, thus the node N3 is coupled to VSS and the transistors T3 and T4 turn off.

During time period t3, transistor T17 turns off due to the low voltage level of the output signal N, thus the voltage level of node N3 is at high voltage level due to the high voltage of the second clock signal XCLK, and thus transistors T4, T3 and T13 turn on. The output signal N+1 is at high voltage and the voltage level N4 is also at high voltage level because transistor T13 turns on, thus transistors T15 and T16 turn on. The output signal N and the gate of transistor T2 are coupled to the VSS through transistors T15 and T16 to ensure that the output signal N will not vary due to the noise.

Additionally t1, t2 and t3, the output signal N is coupled to VSS through transistor T3 when the first clock signal is at low voltage level, and the output signal N is coupled to VSS through transistor T8 when the second clock signal is at low voltage level. According to the described pull-down mechanism, the output signal N can stay in the off state without the noise effect.

Figure 1:
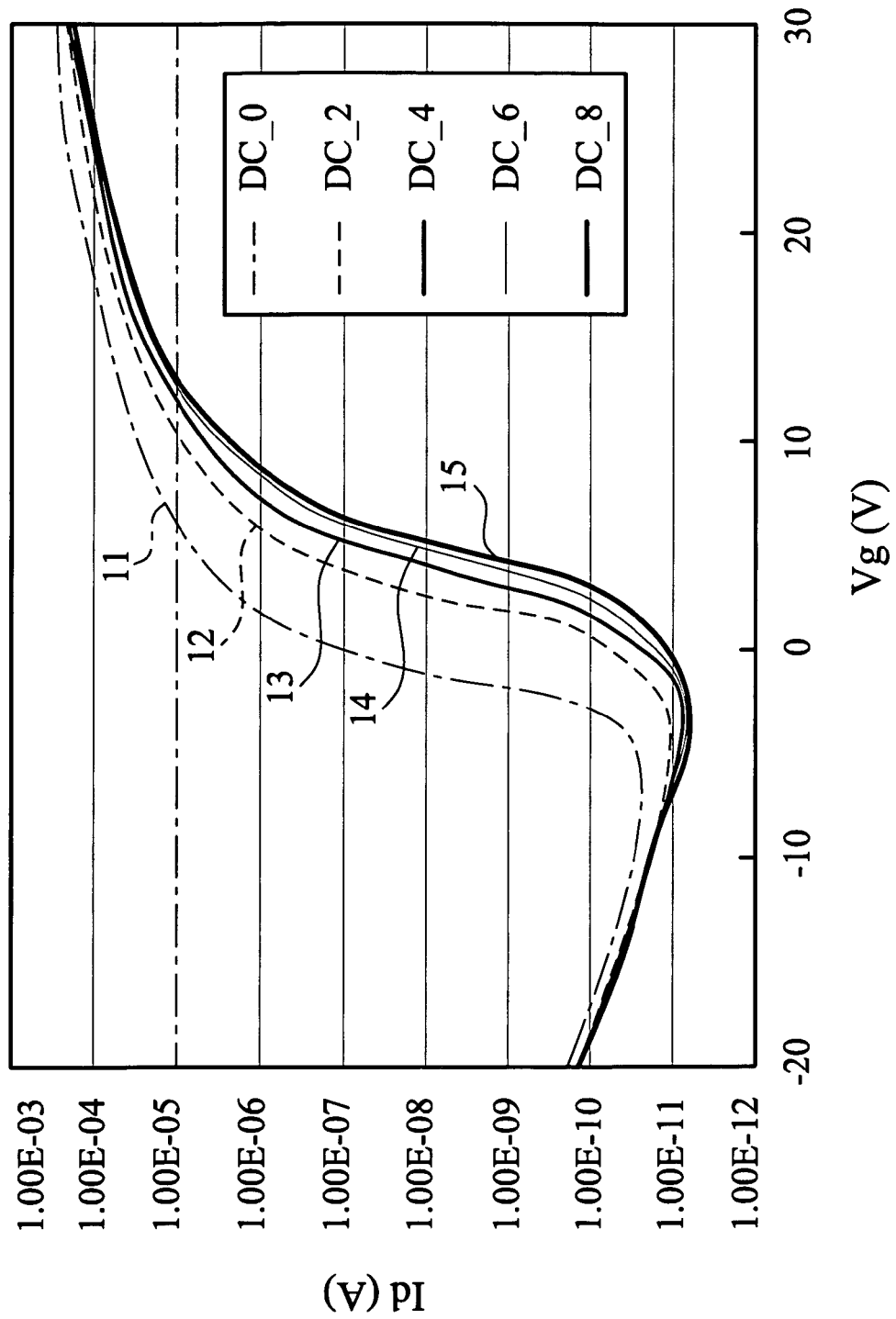
FIG. 1 is a voltage-current schematic diagram of a TFT transistor fabricated in a 300um process.
Figure 2:
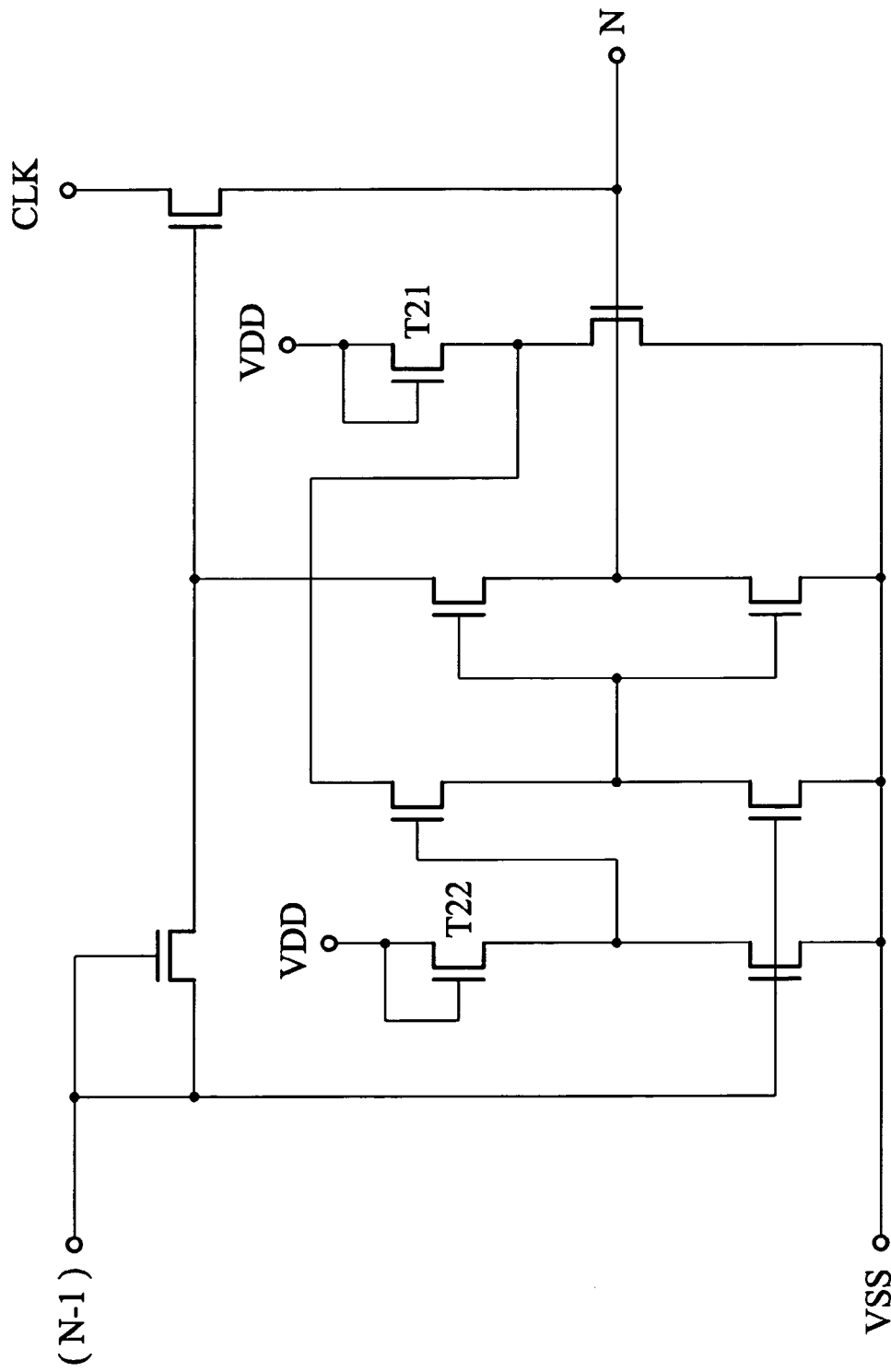
FIG. 2 is a circuit diagram of a conventional shift register.
Figure 3:
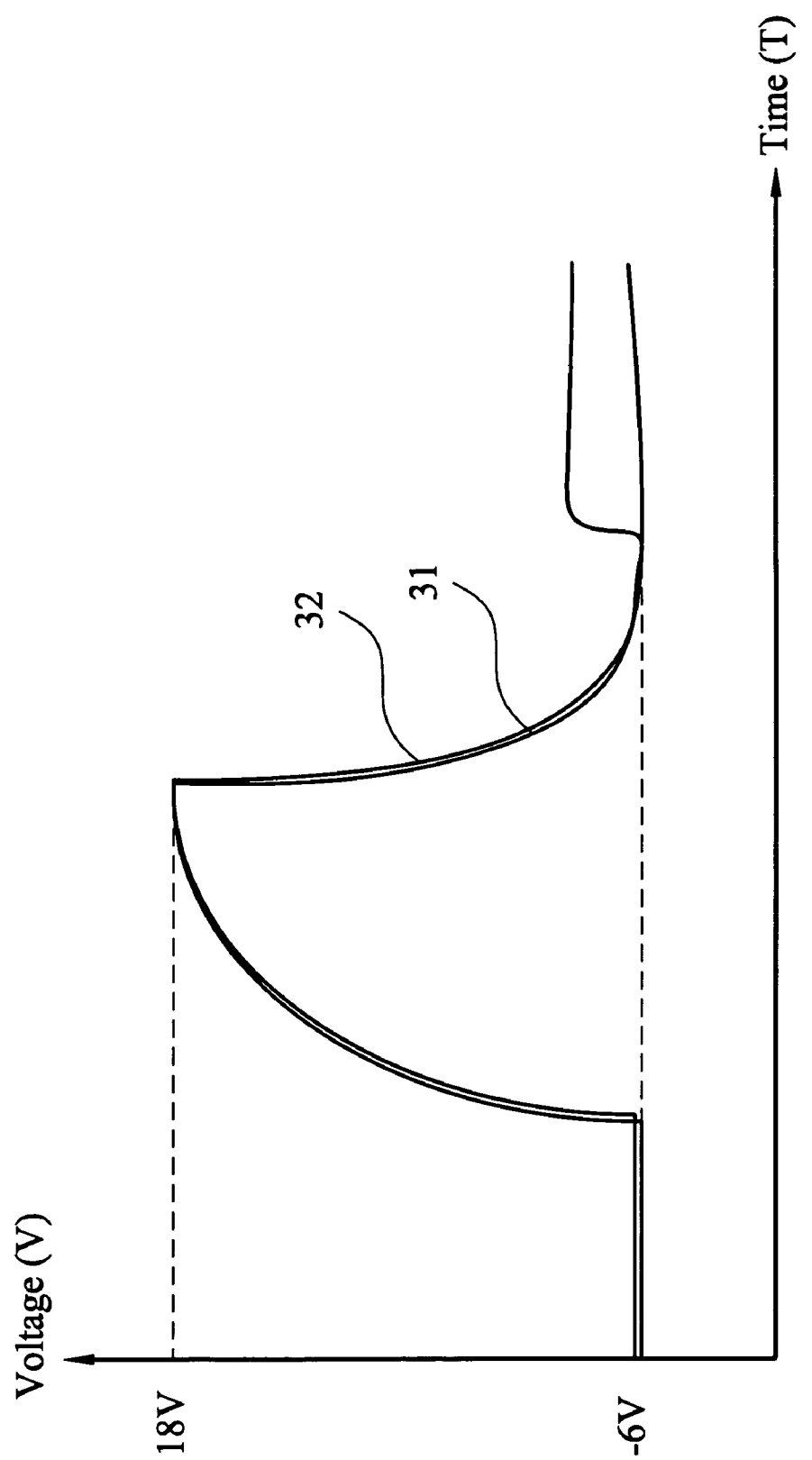
FIG. 3 is a schematic diagram of the output signal of shift register of FIG. 2.

In the circuit of FIG. 10, the shift register uses the output signal N+1 of post-stage shift register as a voltage source to keep the voltage level of output signal N in the low voltage level to avoid the voltage shifting caused by noise. Compared with the 100% duty cycle of transistors T21 and T22 of the conventional shift register of FIG. 1, the threshold voltage shifting of transistors of the shift register according to the invention reduces because the first and second clock signals have only 50% duty cycle, and the falling time of output signal N also reduces because of transistors T15 and T16.

While the invention has been described by way of examples and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shift register circuit having a series of cascading shift registers, comprising:
    a first transistor having a gate, a first source/drain, and a second source/drain, wherein the gate and the first source/drain of the first transistor is adapted to receive a output signal of a pre-stage shift register;
    a second transistor having a gate, a first source/drain, and a second source/drain, wherein the gate of the second transistor is coupled to the second source/drain of the first transistor, the first source/drain of the second transistor is coupled to a first clock signal and the second source/drain of the second transistor is coupled to a output terminal;
    a first pull-down module, coupled to the output terminal, for receiving the first clock signal, wherein the output terminal is coupled to a first voltage level when the output signal of the pre-stage shift register and the first clock signal is at a low voltage level; and
    a second pull-down module, coupled to the output terminal, for receiving a second clock signal, wherein the output terminal is coupled to the first voltage level when the output signal of the pre-stage shift register and a second clock signal is at the low voltage level.

2. The circuit as claimed in claim 1, further comprising a third pull-down module for receiving a output signal of a post-stage shift register, wherein the output terminal is coupled to the first voltage level when the output signal terminal of the post-stage shift register is at a high voltage level.

3. The circuit as claimed in claim 1, further comprising a first switch coupled to the output terminal and the first pull-down module, wherein the first switch turns off the first pull-down module when the output terminal is at the high voltage level.

4. The circuit as claimed in claim 1, wherein the phase difference between the first clock signal and the second clock signal is 180°.

5. The circuit as claimed in claim 1, wherein the first clock signal has a duty cycle equal to or less than 50%.

6. The circuit as claimed in claim 1, wherein the first pull-down module comprises:
    a third transistor having a gate, a first source/drain, and a second source/drain, wherein the first source/drain of the third transistor is coupled to the output terminal and the second source/drain of the third transistor is coupled to the first voltage level;
    a fourth transistor having a gate, a first source/drain, and a second source/drain, wherein the second source/drain of the fourth transistor is coupled to the first voltage level, the gate of the fourth transistor is coupled to the gate of the third transistor and the first source/drain of the fourth transistor is coupled to the gate of the second transistor;
    a fifth transistor having a gate, a first source/drain, and a second source/drain, wherein the gate and the first source/drain of the fifth transistor are adapted to receive the second clock signal and the second source/drain of the fifth transistor is coupled to the gate of the third transistor;
    a sixth transistor having a gate, a first source/drain, and a second source/drain, wherein the second source/drain of the sixth transistor is coupled to the first voltage level, the gate of the sixth transistor is adapted to receive the first clock signal, and the second source/drain of the sixth transistor is coupled to the gate of the third transistor; and
    a seventh transistor having a gate, a first source/drain, and a second source/drain, wherein the second source/drain of the seventh transistor is coupled to the first voltage level, the gate of the seventh transistor is adapted to receive the output signal of the pre-stage shift register, and the seventh transistor is coupled to the gate of the third transistor.

7. The circuit as claimed in claim 1, wherein the second pull-down module comprises:
    an eighth transistor having a gate, a first source/drain, and a second source/drain, wherein the first source/drain of the eighth transistor is coupled to the output terminal and the second source/drain of the eighth transistor is coupled to the first voltage level;
    a ninth transistor having a gate, a first source/drain, and a second source/drain, wherein the second source/drain of the ninth transistor is coupled to the first voltage level, the gate of the ninth transistor is coupled to the gate of the eighth transistor, and the second source/drain of the ninth transistor is coupled to the gate of the second transistor;
    a tenth transistor having a gate, a first source/drain, and a second source/drain, wherein the gate and the first source/drain of the tenth transistor is adapted to receive the first clock signal, and the second source/drain of the tenth transistor is coupled to the gate of the eighth transistor;
    an eleventh transistor having a gate, a first source/drain, and a second source/drain, wherein the second source/drain of the eleventh transistor is coupled to the first voltage level, the gate of the eleventh transistor is adapted to receive the second clock signal, and the first source/drain of the eleventh transistor is coupled to the gate of the eighth transistor; and
    a twelfth transistor having a gate, a first source/drain, and a second source/drain, wherein the second source/drain of the twelfth transistor is coupled to the first voltage level, the gate of the twelfth transistor is coupled to the output terminal, and the first source/drain of the twelfth transistor is coupled to the gate of the eighth transistor.

8. The circuit as claimed in claim 2, wherein the third pull-down module further comprises:
    a thirteenth transistor having a gate, a first source/drain and a second source/drain, wherein the gate of the thirteenth transistor is coupled to the first pull-down module, and the first source/drain of the thirteenth transistor is adapted to receive the output signal terminal of the post-stage shift register;

a fourteenth transistor having a gate, a first source/drain, and a second source/drain, wherein the first source/drain of the fourteenth transistor is coupled to the second source/drain of the thirteenth transistor, the second source/drain of the fourteenth transistor is coupled to the first voltage level, and the gate of the fourteenth transistor is adapted to receive the first clock signal;

a fifteenth transistor having a gate, a first source/drain, and a second source/drain, wherein the gate of the fifteenth transistor is coupled to the second source/drain of the thirteenth transistor, the second source/drain of the fifteenth transistor is coupled to the first voltage level, and the first source/drain of the fifteenth transistor is coupled to the output terminal; and a sixteenth transistor having a gate, a first source/drain, and a second source/drain, wherein the gate of the sixteenth transistor is coupled to the second source/drain of the thirteenth transistor, the second source/drain of the sixteenth transistor is coupled to the first voltage level, and the first source/drain of the sixteenth transistor is coupled to the gate of the second transistor.

9. The circuit as claimed in claim 3, wherein the first switch comprises a seventeenth transistor having a gate, a first source/drain, and a second source/drain, wherein the gate of the seventeenth transistor is coupled to the output, the first source/drain of the seventeenth transistor is coupled to the first pull-down module, and the second source/drain of the seventeenth transistor is coupled to the first voltage level.

10. The circuit as claimed in claim 1, wherein the output signal of the pre-stage shift register is a start pulse signal when the shift register is the first stage shift register.

11. A shift register circuit having a series of cascading shift registers, comprising:

a first transistor having a gate, a first source/drain, and a second source/drain, wherein the gate and the first source/drain of the first transistor are adapted to receive a output signal of a pre-stage shift register;

a second transistor having a gate, a first source/drain, and a second source/drain, wherein the gate of the second transistor is coupled to the second source/drain of the first transistor, the first source/drain of the second transistor is adapted to receive a first clock signal and the second source/drain of the second transistor is coupled to a output terminal;

a third transistor having a gate, a first source/drain, and a second source/drain, wherein the first source/drain of the third transistor is coupled to the output terminal and the second source/drain of the third transistor is coupled to the first voltage level;

a fourth transistor having a gate, a first source/drain, and a second source/drain, wherein the second source/drain of the fourth transistor is coupled to the first voltage level, the gate of the fourth transistor is coupled to the gate of the third transistor and the first source/drain of the fourth transistor is coupled to the gate of the second transistor;

a fifth transistor having a gate, a first source/drain, and a second source/drain, wherein the gate and the first source/drain of the fifth transistor is coupled to the second clock signal and the second source/drain of the fifth transistor is coupled to the gate of the third transistor;

a sixth transistor having a gate, a first source/drain, and a second source/drain, wherein the second source/drain of the sixth transistor is coupled to the first voltage level, the gate of the sixth transistor is adapted to receive the first clock signal, and the second source/drain of the sixth transistor is coupled to the gate of the third transistor;

a seventh transistor having a gate, a first source/drain, and a second source/drain, wherein the second source/drain of the seventh transistor is coupled to the first voltage level, the gate of the seventh transistor is adapted to receive the output signal of the pre-stage shift register, and the seventh transistor is coupled to the gate of the third transistor;

an eighth transistor having a gate, a first source/drain, and a second source/drain, wherein the first source/drain of the eighth transistor is coupled to the output terminal and the second source/drain of the eighth transistor is coupled to the first voltage level;

a ninth transistor having a gate, a first source/drain, and a second source/drain, wherein the second source/drain of the ninth transistor is coupled to the first voltage level, the gate of the ninth transistor is coupled to the gate of the eighth transistor, and the second source/drain of the ninth transistor is coupled to the gate of the second transistor;

a tenth transistor having a gate, a first source/drain, and a second source/drain, wherein the gate and the first source/drain of the tenth transistor is adapted to receive the first clock signal, and the second source/drain of the tenth transistor is coupled to the gate of the eighth transistor;

an eleventh transistor having a gate, a first source/drain, and a second source/drain, wherein the second source/drain of the eleventh transistor is coupled to the first voltage level, the gate of the eleventh transistor is adapted to receive the second clock signal, and the first source/drain of the eleventh transistor is coupled to the gate of the eighth transistor; and a twelfth transistor having a gate, a first source/drain, and a second source/drain, wherein the second source/drain of the twelfth transistor is coupled to the first voltage level, the gate of the twelfth transistor is coupled to the output terminal, and the first source/drain of the twelfth transistor is coupled to the gate of the eighth transistor.

12. The circuit as claimed in claim 11, further comprising a third pull-down module for receiving a output signal of a post-stage shift register, wherein the output is coupled to the first voltage level when the output signal of the post-stage shift register is at a high voltage level, the module having:

a thirteenth transistor having a gate, a first source/drain, and a second source/drain, wherein the gate of the thirteenth transistor is coupled to the gate of the third transistor, and the first source/drain of the thirteenth transistor is adapted to receive the output signal of the pre-stage shift register;

a fourteenth transistor having a gate, a first source/drain, and a second source/drain, wherein the he first source/drain of the fourteenth transistor is coupled to the second source/drain of the thirteenth transistor, the second source/drain of the fourteenth transistor is coupled to the first voltage level, and the gate of the fourteenth transistor is adapted to receive the first clock signal;

a fifteenth transistor having a gate, a first source/drain, and a second source/drain, wherein the gate of the fifteenth transistor is coupled to the second source/drain of the thirteenth transistor, the second source/drain of the fifteenth transistor is coupled to the first voltage level, and the first source/drain of the fifteenth transistor is coupled to the output terminal; and a sixteenth transistor having a gate, a first source/drain, and a second source/drain, wherein the gate of the sixteenth transistor is coupled to the second source/drain of the thirteenth transistor, the second source/drain of the sixteenth transistor is coupled to the first voltage level, and the first source/drain of the sixteenth transistor is coupled to the gate of the second transistor.

13. The circuit as claimed in claim 11, further comprising a first switch to turn off the third transistor when the output is at a high voltage level, having:

a seventeenth transistor having a gate, a first source/drain and a second source/drain, wherein the gate of the seventeenth transistor is coupled to the output terminal, the first source/drain of the seventeenth transistor is coupled to the gate of the third transistor, and the second source/drain of the seventeenth transistor is coupled to the first voltage level.

14. The circuit as claimed in claim 11, wherein the phase difference between the first clock signal and the second clock signal is 180°.

15. The circuit as claimed in claim 11, wherein the first clock signal has a duty cycle equal to or less than 50%.

16. The circuit as claimed in claim 11, wherein the output signal of the pre-stage shift register is a start pulse signal when the shift register is the first stage shift register.

17. The circuit as claimed in claim 11, wherein the transistors are NMOS type transistors.

18. The circuit as claimed in claim 11, wherein the transistors are thin film transistors (TFTs) disposed on a glass substrate.

* * * * *